United States Patent
Izuha et al.

(10) Patent No.: US 7,631,287 B2
(45) Date of Patent: Dec. 8, 2009

(54) CALCULATING METHOD, VERIFICATION METHOD, VERIFICATION PROGRAM AND VERIFICATION SYSTEM FOR EDGE DEVIATION QUANTITY, AND SEMICONDUCTOR DEVICE MANUFACTURING METHOD

(75) Inventors: Kyoko Izuha, Yokohama (JP); Toshiya Kotani, Machida (JP); Satoshi Tanaka, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 171 days.

(21) Appl. No.: 11/727,288

(22) Filed: Mar. 26, 2007

(65) Prior Publication Data
US 2007/0226676 A1   Sep. 27, 2007

Related U.S. Application Data

(62) Division of application No. 10/801,798, filed on Mar. 17, 2004, now Pat. No. 7,200,833.

(30) Foreign Application Priority Data

Mar. 19, 2003   (JP)   ............................. 2003-074821

(51) Int. Cl.
    *G06F 17/50*   (2006.01)
(52) U.S. Cl. .......................................... 716/20; 716/19
(58) Field of Classification Search .................. 716/19, 716/20
    See application file for complete search history.

(56) References Cited

U.S. PATENT DOCUMENTS

| 5,811,211 | A | 9/1998 | Tanaka et al. |
| 6,058,203 | A | 5/2000 | Tsudaka |
| 6,470,489 | B1 | 10/2002 | Chang et al. |
| 6,547,409 | B2 | 4/2003 | Kiest et al. |
| 6,934,410 | B1 * | 8/2005 | Aleshin et al. ............... 382/144 |
| 7,095,884 | B2 | 8/2006 | Yamaguchi et al. |
| 7,138,629 | B2 | 11/2006 | Noji et al. |
| 2001/0019625 | A1 | 9/2001 | Kenan et al. |
| 2002/0164064 | A1 | 11/2002 | Karklin et al. |
| 2003/0021463 | A1 | 1/2003 | Yamaguchi et al. |

* cited by examiner

*Primary Examiner*—Vuthe Siek
*Assistant Examiner*—Aric Lin
(74) *Attorney, Agent, or Firm*—Finnegan, Henderson, Farabow, Garrett & Dunner, L.L.P.

(57) ABSTRACT

A method in which a desired pattern is compared with a finish pattern to be formed on a wafer, which is predicted from a design pattern, based on a calculation of a light beam intensity, and a deviation quantity of the finish pattern from the desired pattern at each edge of the finish pattern and the desired pattern is calculated, comprising setting a reference light beam intensity for setting the desired pattern on a wafer, setting an evaluation point for comparison of the finish pattern with the desired pattern, calculating a light beam intensity at the evaluation point, calculating a differentiation value of the light beam intensity at the evaluation point, calculating an intersection of the differentiation value with the reference light beam intensity, and calculating a difference between the intersection and the evaluation point, the difference defining an edge deviation quantity of the finish pattern from the desired pattern.

6 Claims, 11 Drawing Sheets

CALCULATING METHOD, VERIFICATION METHOD, VERIFICATION PROGRAM AND VERIFICATION SYSTEM FOR EDGE DEVIATION QUANTITY, AND SEMICONDUCTOR DEVICE MANUFACTURING METHOD

CROSS-REFERENCE TO RELATED APPLICATIONS

This application is a division of Prior application Ser. No. 10/801,798, filed on Mar. 17, 2004 now U.S. Pat. No. 7,200,833, which is incorporated in its entirety herein by reference. This application is also based upon and claims the benefit of priority from prior Japanese Patent Application No. 2003-074821, filed Mar. 19, 2003, the entire contents of which are incorporated herein by reference.

BACKGROUND OF THE INVENTION

1. Field of the Invention

The present invention relates to a technique for manufacturing an exposure mask for use in a light or X-ray exposure method, and more particularly, the present invention relates to a calculation method, a verification method, a verification program, a verification system, and a semiconductor device manufacturing method, for an edge deviation quantity of a finish pattern from a desired pattern in order to obtain a fine pattern.

2. Description of the Related Art

Advancement of a semiconductor manufacturing technique in recent years is very remarkable, and a semiconductor device such as LSI whose size is 0.18 μm in minimum design rule is mass-produced. Such a fine LSI is achieved by remarkable advance of a fine pattern forming techniques such as a mask process technique, a photolithography technique, and an etching technique.

In an age in which a pattern size is large, an LSI pattern to be formed on a wafer is depicted as a design pattern as is; a mask pattern which is faithful to the design pattern is produced; the mask pattern is transferred onto the wafer by means of a projection optical system; and a target layer is etched, whereby a pattern which is almost identical to the design pattern can be formed on the wafer. However, with advancement of fine patterning, it becomes difficult to faithfully form a pattern in each process. Thus, there occurs a problem that the finish pattern is not provided as the desired pattern.

With respect to how patterns are called, such patterns are discriminated from one another as follows. A pattern desired as an LSI in view of device features, wiring characteristics or the like is referred to as a "desired pattern", a pattern obtained by designing a pattern as close to the desired pattern as possible is referred to as a "design pattern", and a pattern to be formed on a wafer, which is predicted from the design pattern, is referred to as a "finish pattern".

In particular, in lithography and an etching process which are the most important to achieve fine processing, another pattern layout environment allocated in a peripheral region of a region for forming a pattern is greatly influenced on dimensional precision of the pattern. As a technique for reducing the influence, there has been reported a correction technique such as a technique for Optical Proximity Correction (hereinafter, simply referred to as OPC) or a technique for Process Proximity Correction (hereinafter, simply referred to as PPC) in which an auxiliary pattern is added in advance in a design pattern such that a finish pattern is close to the desired pattern.

However, with complication of the OPC and PPC techniques in recent years, a pattern produced by a device designer and a mask pattern for use during exposure are greatly different from each other, and thus, a finish pattern to be formed on a wafer cannot be easily predicted. Therefore, in the case where a desired pattern cannot be obtained as a result of simulation after the finish pattern has been predicted by using an OPC tool and a lithography simulator, a design technique is employed for correcting a design pattern. In such a design technique, it is required that an edge deviation quantity indicating a deviation between a design pattern and a finish pattern is calculated within a short period of time.

There has been proposed that the edge deviation quantity is calculated by computing a light beam intensity using a Hopkins's Formula (U.S. Pat. No. 6,470,489 (page 20)). A conventional method of calculating an edge deviation quantity based on the Hopkins Formula will be described with reference to FIGS. 13 to 15.

FIG. 13 schematically shows a desired pattern 41 and a design pattern 42 with respect to a method of calculating an edge deviation quantity, and also schematically shows a light beam intensity obtained from the design pattern 42. These patterns are depicted to correspond to a position coordinate shown in FIG. 13. FIG. 14 is a flow chart showing an outline of procedures for obtaining an edge deviation quantity. FIG. 15 is a flow chart showing calculation procedures in the Hopkins Formula in steps S54 and S55.

First, in designing an LSI or the like, the desired pattern 41 required to ensure device characteristics and the design pattern 42 to achieve the desired pattern 41 are produced (step S51). The design pattern 42 is not applied with OPC or the like.

Next, an exposure reference light beam intensity (Ith) for forming the design pattern 42 on a wafer is set (step S52).

Then, in order to make a comparison of a finish pattern obtained by calculation based on the design pattern 42 with the desired pattern 41, a plurality of evaluation points, for example, two evaluation points, i.e., an evaluation point 51 indicating an edge position of the desired pattern 41 and an evaluation point 52 in the vicinity of the evaluation point 51, are set on a light beam intensity characteristic curve (step S53).

Then, a light beam intensity $I(t_5)$ in the evaluation point 51 (position coordinate $t_5$) of an edge position of the desired pattern 41 is calculated from the Hopkins Formula described later (step S54).

Next, a light beam intensity $I(t_6)$ in a position coordinate $t_6$ of the evaluation point 52 which is slightly displaced from the position coordinate $t_5$ is calculated from the Hopkins Formula (step S55).

Here, in the above steps S54 and S55, a partial coherent image forming Formula of Hopkins for use in calculation of a light beam intensity is expressed as follows.

$$I(t) = \iint_{-\infty}^{\infty} TCC(\omega, \omega') \times M(\omega) \times M(\omega')^* \times \exp(i(\omega-\omega')t) \, d\omega d\omega'$$

In Formula (1), TCC denotes a Transmission Cross Coefficient; I(t) denotes a light beam intensity in a position coordinate "t"; M denotes a Fourier transform of a mask complex transmission rate distribution in a frequency plane; M* denotes a complex conjugate of the Fourier transform of the mask complex transmission distribution in the frequency plane; "i" denotes an imaginary unit; and ω and ω' denote angular frequencies.

Now, calculation procedures of Formula (1) will be described with reference to a flow chart of FIG. 15.

First, calculation of TCC(ω, ω') is carried out (step S61).

Subsequently, M(ω), the Fourier transform of complex amplitude transmission distribution of the design pattern is carried out, and M(ω') is determined (step S62).

Next, a product of the calculated results in steps S61 and S62, which expressed by TCC(ω, ω')×M(ω)×M(ω'), is calculated (step S63).

Then, a product of the formula in step S63 and exp (i(ω−ω')t) which is the reverse Fourier transform in step S63 is integrated with respect to ω, ω' (step S64).

As has been described above, by the above-described Hopkins Formula of Formula (1), light beam intensity $I(t_5)$, $I(t_6)$ of the position coordinate $t_5$, $t_6$ of the evaluation points 51 and 52 are calculated, and a Formula of a straight line 53 connecting the light beam intensity $I(t_5)$, $I(t_6)$ of the position coordinate $t_5$, $t_6$ of these evaluation points 51 and 52 is calculated (step S56).

Next, from this straight line 53, a position coordinate $t_7$ of an intersection 54 at which the light beam intensity becomes a reference light beam intensity (Ith) is calculated (step S57).

Then, a difference between the position coordinate $t_5$ and the position coordinate $t_7$ is calculated, and this difference is defined as an edge deviation quantity 56 (step S58).

In this manner, it is quantitatively determined how large the finish pattern calculated from the design pattern 42 is deviated from the desired pattern 41.

In the above-described conventional method of calculating an edge deviation quantity, the light beam intensities in the position coordinates $t_5$ and $t_6$ of the two evaluation points 51 and 52 are calculated by the above-described Hopkins Formula. In this case, it is required to calculate the reverse Fourier transform of an angular frequency distribution at each of the position coordinates. In particular, calculation of a trigonometric function (cos(ω−ω')t−isin(ω−ω')t) expanding a portion of exp(i(ω−ω')t) on which a great calculation load is applied is carried out two times. Thus, there has been a problem that much time is required for calculation of the trigonometric function, and an edge deviation quantity cannot be calculated with high precision for a short period of time.

BRIEF SUMMARY OF THE INVENTION

According to an aspect of the present invention, there is provided an edge deviation calculation method in which a desired pattern is compared with a finish pattern to be formed on a wafer, which is predicted from a design pattern, based on a calculation of a light beam intensity, and a deviation quantity of the finish pattern from the desired pattern at each of edges of the finish pattern and the desired pattern is calculated, the calculation method comprising:

setting a reference light beam intensity for setting the desired pattern on a wafer;

setting an evaluation point for comparison of the finish pattern with the desired pattern;

calculating a light beam intensity at the evaluation point;

calculating a differentiation value of the light beam intensity at the evaluation point;

calculating an intersection of the differentiation value with the reference light beam intensity; and calculating a difference between the intersection and the evaluation point, wherein the difference is defined as an edge deviation quantity of the finish pattern from the desired pattern.

According to another aspect of the present invention, there is provided an edge deviation calculation method in which a desired pattern is compared with a finish pattern to be formed on a wafer, which is predicted from a design pattern, based on a calculation of a light beam intensity, and a deviation quantity of the finish pattern from the desired pattern at each of edges of the finish pattern and the desired pattern is calculated, the calculation method comprising:

setting a reference light beam intensity for setting the desired pattern on a wafer;

setting an evaluation point for comparison of the finish pattern with the desired pattern;

calculating a light beam intensity at the evaluation point;

calculating a differentiation value of the light beam intensity at the evaluation point; and dividing a difference between the light beam intensity at the evaluation point and the reference light beam intensity by the differentiation value, wherein a result of the division is defined as an edge deviation quantity of the finish pattern from the desired pattern.

According to a further aspect of the present invention, there is provided an edge deviation quantity verification method in which a desired pattern is compared with a finish pattern to be formed on a wafer, which is predicted from a design pattern, based on a calculation of a light beam intensity, a deviation quantity of the finish pattern from the desired pattern at each of edges of the finish pattern and the desired pattern is calculated, and it is determined whether or not the design pattern is to be corrected based on a result of the calculation of the deviation quantity, the verification method comprising:

setting a reference light beam intensity for setting the desired pattern on a wafer;

setting an evaluation point for comparison of the finish pattern with the desired pattern;

calculating a light beam intensity at the evaluation point;

calculating a differentiation value of the light beam intensity at the evaluation point;

calculating an intersection of the differentiation value with the reference light beam intensity;

calculating a difference between the intersection and the evaluation point, and define the calculated difference as an edge deviation quantity of the finish pattern from the desired pattern; and verifying the edge deviation quantity, wherein, in the case where the edge deviation quantity exceeds an allowable range, the design pattern is corrected based on the deviation quantity.

According to a further aspect of the present invention, there is provided an edge deviation quantity verification method in which a desired pattern is compared with a finish pattern to be formed on a wafer, which is predicted from a design pattern, based on a calculation of a light beam intensity, a deviation quantity of the finish pattern from the desired pattern at each of edges of the finish pattern and the desired pattern is calculated, and it is determined whether or not the design pattern is to be corrected based on a result of the calculation of the deviation quantity, the verification method comprising:

setting a reference light beam intensity for setting the desired pattern on a wafer;

setting an evaluation point for comparison of the finish pattern with the desired pattern;

calculating a light beam intensity at the evaluation point;

calculating a differentiation value of the light beam intensity at the evaluation point;

dividing a difference between the light beam intensity at the evaluation point and the reference light beam intensity by the differentiation value, and defining a result of the division as an edge deviation quantity; and verifying the edge deviation quantity, wherein, in the case where the edge deviation quantity exceeds an allowable range, the design pattern is corrected based on the deviation quantity.

According to a further aspect of the present invention, there is provided an edge deviation quantity verification program in which a desired pattern is compared with a finish pattern to be formed on a wafer, which is predicted from a design pattern, based on a calculation of a light beam intensity, a deviation quantity of the finish pattern from the desired pattern at each of edges of the finish pattern and the desired pattern is calculated, and it is verified whether or not the design pattern is to be corrected based on a result of the calculation of the deviation quantity, the verification program comprising:

setting a reference light beam intensity for setting the desired pattern on a wafer;

setting an evaluation point for comparison of the finish pattern with the desired pattern;

calculating a light beam intensity at the evaluation point;

calculating a differentiation value of the light beam intensity at the evaluation point;

calculating an intersection of the differentiation value with the reference light beam intensity;

calculating a difference between the intersection and the evaluation point, and define the calculated difference as an edge deviation quantity of the finish pattern from the desired pattern; and verifying the edge deviation quantity, wherein, in the case where the edge deviation quantity exceeds an allowable range as a result of the verification, the design pattern is corrected based on the deviation quantity.

According to a further aspect of the present invention, there is provided an edge deviation quantity verification program in which a desired pattern is compared with a finish pattern to be formed on a wafer, which is predicted from a design pattern, based on a calculation of a light beam intensity, a deviation quantity of the finish pattern from the desired pattern at each of edges of the finish pattern and the desired pattern is calculated, and it is verified whether or not the design pattern is to be corrected based on a result of the calculation of the deviation quantity, the verification program comprising:

setting a reference light beam intensity for setting the desired pattern on a wafer;

setting an evaluation point for comparison of the finish pattern with the desired pattern;

calculating a light beam intensity at the evaluation point;

calculating a differentiation value of the light beam intensity at the evaluation point;

dividing a difference between the light beam intensity at the evaluation point and the reference light beam intensity by the differentiation value, and defining a result of the division as an edge deviation quantity; and verifying the edge deviation quantity, wherein, in the case where the edge deviation quantity exceeds an allowable range, the design pattern is corrected based on the deviation quantity.

According to a further aspect of the present invention, there is provided an edge position quantity verification system having an input/output circuit, a storage, a computer, a display and a controller, in which a desired pattern is compared with a finish pattern to be formed on a wafer, which is predicted from a design pattern, based on a calculation of a light beam intensity, a deviation quantity of the finish pattern from the desired pattern at each of edges of the finish pattern and the desired pattern is calculated, and it is verified whether or not the design pattern is to be corrected based on a result of the calculation of the deviation quantity, the verification system comprising:

setting a reference light beam intensity for setting the desired pattern on a wafer;

setting an evaluation point for comparison of the finish pattern with the desired pattern;

calculating a light beam intensity at the evaluation point;

calculating a differentiation value of the light beam intensity at the evaluation point;

calculating an intersection of the differentiation value with the reference light beam intensity;

calculating a difference between the intersection and the evaluation point, and define the calculated difference as an edge deviation quantity of the finish pattern from the desired pattern; and verifying the edge deviation quantity, wherein, in the case where the edge deviation quantity exceeds an allowable range as a result of the verification, the design pattern is corrected based on the deviation quantity.

According to a further aspect of the present invention, there is provided an edge position quantity verification system having an input/output circuit, a storage, a computer, a display and a controller, in which a desired pattern is compared with a finish pattern to be formed on a wafer, which is predicted from a design pattern, based on a calculation of a light beam intensity, a deviation quantity of the finish pattern from the desired pattern at each of edges of the finish pattern and the desired pattern is calculated, and it is verified whether or not the design pattern is to be corrected based on a result of the calculation of the deviation quantity, the verification system comprising:

setting a reference light beam intensity for setting the desired pattern on a wafer;

setting an evaluation point for comparison of the finish pattern with the desired pattern;

calculating a light beam intensity at the evaluation point;

calculating a differentiation value of the light beam intensity at the evaluation point;

dividing a difference between the light beam intensity at the evaluation point and the reference light beam intensity by the differentiation value, and defining a result of the division as an edge deviation quantity; and verifying the edge deviation quantity, wherein, in the case where the edge deviation quantity exceeds an allowable range, the design pattern is corrected based on the deviation quantity.

According to a further aspect of the present invention, there is provided a semiconductor device manufacturing method in which a desired pattern is compared with a finish pattern to be formed on a semiconductor wafer, which is predicted from a design pattern, based on a calculation of a light beam intensity, a deviation quantity of the finish pattern from the desired pattern at each of edges of the finish pattern and the desired pattern is calculated, it is verified whether or not the design pattern is to be corrected based on a result of the calculation of the deviation quantity, and a semiconductor device is manufactured by using a mask having the design pattern corrected based on the verification, the manufacturing method comprising:

setting a reference light beam intensity for setting the desired pattern on a wafer;

setting an evaluation point for comparison of the finish pattern with the desired pattern;

calculating a light beam intensity at the evaluation point;

calculating a differentiation value of the light beam intensity at the evaluation point;

calculating an intersection of the differentiation value with the reference light beam intensity;

calculating a difference between the intersection and the evaluation point, and define the calculated difference as an edge deviation quantity of the finish pattern from the desired pattern;

verifying the edge deviation quantity;

correct the design pattern based on the deviation quantity, in the case where the edge deviation quantity exceeds an allowable range;

forming a mask having the design pattern corrected based on the deviation quantity; and forming a pattern corresponding to the corrected design pattern on a semiconductor wafer by using the mask to form a semiconductor device on the semiconductor wafer.

According to a further aspect of the present invention, there is provided a semiconductor device manufacturing method in which a desired pattern is compared with a finish pattern to be formed on a semiconductor wafer, which is predicted from a design pattern, based on a calculation of a light beam intensity, a deviation quantity of the finish pattern from the desired pattern at each of edges of the finish pattern and the desired pattern is calculated, it is verified whether or not the design pattern is to be corrected based on a result of the calculation of the deviation quantity, and a semiconductor device is manufactured by using a mask having the design pattern corrected based on the verification, the manufacturing method comprising:

setting a reference light beam intensity for setting the desired pattern on a wafer;

setting an evaluation point for comparison of the finish pattern with the desired pattern;

calculating a light beam intensity at the evaluation point;

calculating a differentiation value of the light beam intensity at the evaluation point;

dividing a difference between the light beam intensity at the evaluation point and the reference light beam intensity by the differentiation value, and defining a result of the division as an edge deviation quantity; and verifying the edge deviation quantity, correct the design pattern based on the deviation quantity, in the case where the edge deviation quantity exceeds an allowable range;

forming a mask having the design pattern corrected based on the deviation quantity; and forming a pattern corresponding to the corrected design pattern on a semiconductor wafer by using the mask to form a semiconductor device on the semiconductor wafer.

DETAILED DESCRIPTION OF THE INVENTION

Hereinafter, embodiments of the present invention will be described with reference to the accompanying drawings.

First Embodiment

A calculation method and a verification method for an edge deviation quantity according to a first embodiment of the present invention will be described with reference to FIGS. 1 and 2.

Figure 1:
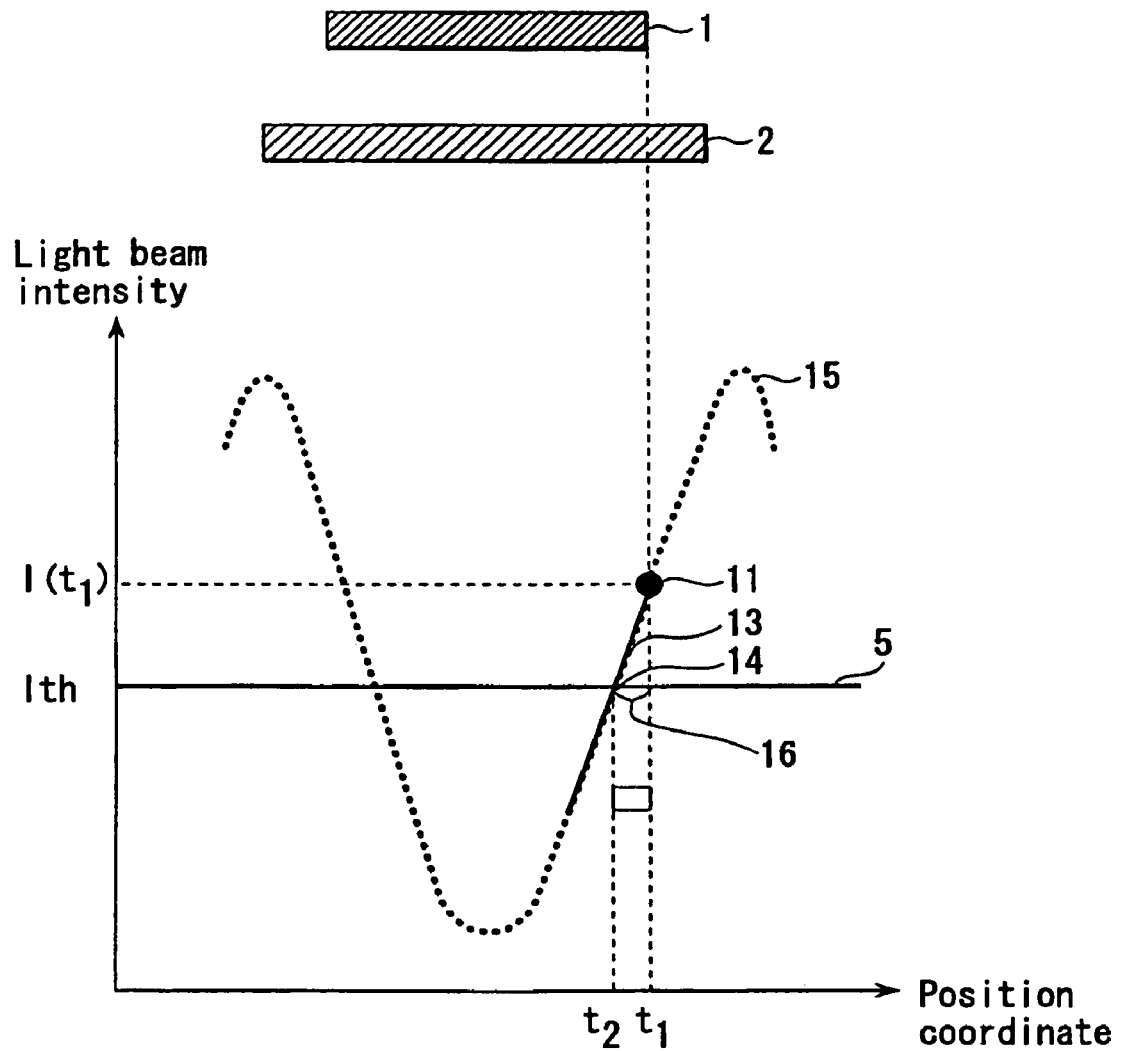
FIG. 1 is a diagram for explaining a method of calculating and verifying an edge position deviation quantity according to a first embodiment of the present invention.
Figure 2:
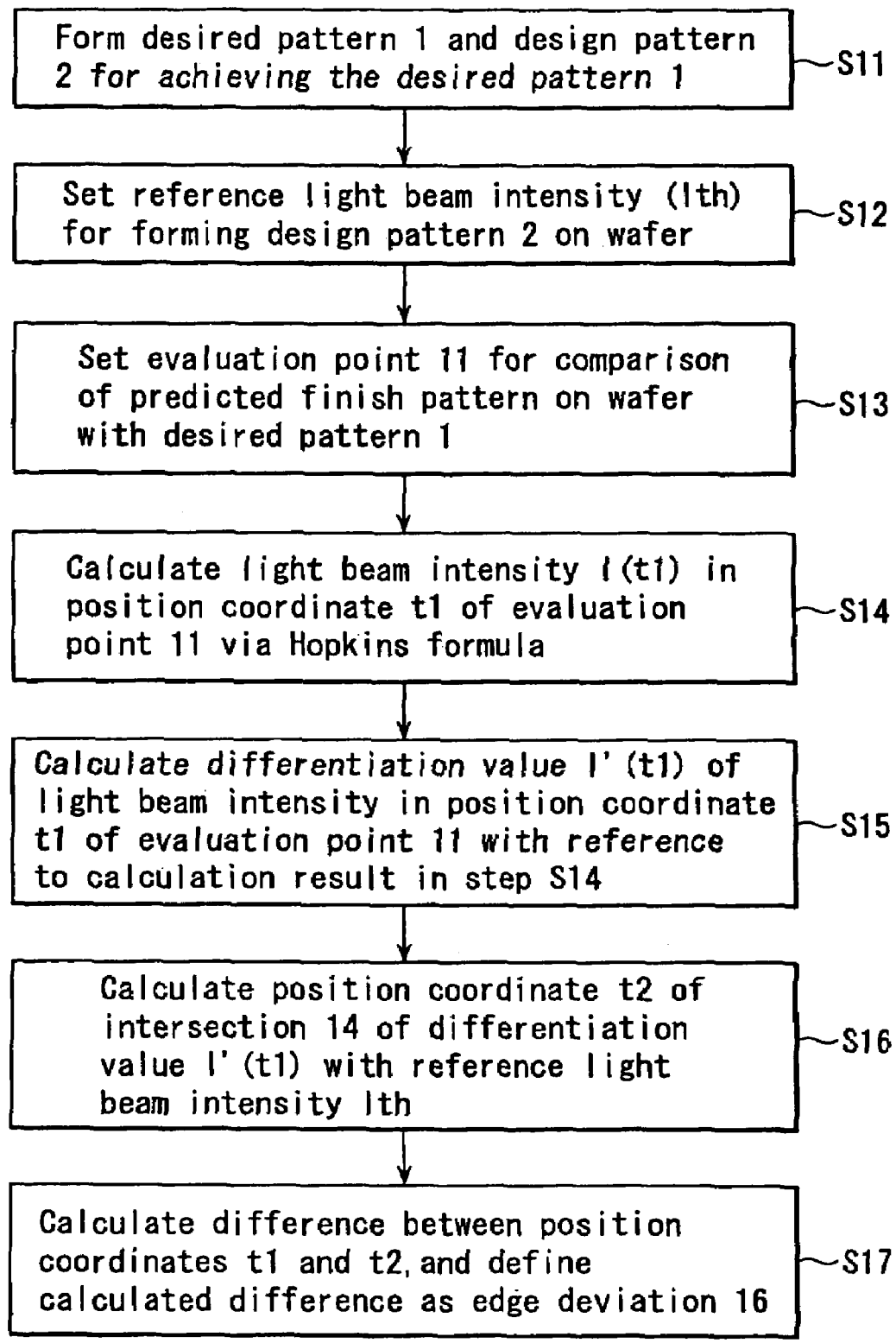
FIG. 2 is a flow chart showing procedures of calculating and verifying an edge deviation quantity according to the first embodiment of the invention.

FIG. 1 schematically shows a desired pattern 1 and a design pattern 2 with respect to an edge deviation quantity calculating method. Also, schematically disclosed is in FIG. 1 a light beam intensity curve obtained from the design pattern 2. The desired pattern 1 and design pattern 2 and the light beam intensity curve are depicted to correspond to a position coordinate shown in FIG. 1. FIG. 2 is a flow chart showing an outline of procedures for obtaining an edge deviation quantity.

First, the desired pattern 1 and the design pattern 2 are formed (step S11). The desired pattern 1 is required to ensure device characteristics in designing an LSI or the like, and the design pattern 2 is required to achieve the desired pattern 1. The design pattern 2 is not corrected by the OPC or the like.

Next, a reference light beam intensity (Ith) for forming the design pattern 2 on a wafer, for example, a semiconductor wafer, is set in relation to an etching process in a later manufacturing step (step S12).

Then, an evaluation point 11 is set at an edge position of the desired pattern 1 for comparison of a predicted finish pattern with the desired pattern 1 (step S13).

Then, a light beam intensity $I(t_1)$ in the position coordinate $t_1$ of the evaluation point 11 of the desired pattern 1 is calculated from the above-described Formula (1) of Hopkins (step S14).

Next, a differentiation value $I'(t_1)$ of the light beam intensity $I(t_1)$ in the position coordinate $t_1$ of the evaluation point 11 is calculated by the formula (2) below (step S15).

$$I'(t) = \int\int_{-\infty}^{\infty} TCC(\omega, \omega') \times M(\omega) \times M(\omega') \times (i(\omega-\omega'))^n \times \exp(i(\omega-\omega')t) d\omega d\omega'$$

In calculation using Formula (2), a portion of $\exp(i(\omega-\omega')t)$ at which a large calculation load is applied refers to a calculation result produced when the light beam intensity $I(t_1)$ is obtained in step S14.

Then, a position coordinate $t_2$ of an intersection 14 at which the light beam intensity becomes the reference light beam intensity Ith is calculated from a straight light 13 denoting a differentiation value in the position coordinate $t_1$ (step S16).

Next, a difference between the position coordinate $t_1$ and the position coordinate $t_2$ is calculated, and this difference is defined as an edge deviation quantity 16 (step S17).

In this manner, it is quantitatively determined how large an edge position of the finish pattern is deviated from the desired pattern 1.

Then, a calculation result of the edge deviation quantity is verified. Based on the verification result, in a case where the edge position of the finish pattern is deviated over the allowable range specified at a device design stage from that of the desired pattern, the design pattern 2 is corrected by OPC, PPC, or the like. Then, the step of calculating the edge deviation quantity described above is again carried out for the corrected design pattern. In this manner, the design pattern is corrected such that the edge deviation quantity between the desired pattern 1 and the finish pattern is within the allowable range specified at the device design.

According to the first embodiment of the present invention described above, in a method of calculating a inclination of light beam intensity in the vicinity of a position coordinate of a desired pattern, Formula (1) is calculated with respect to the position coordinate $t_1$ of an evaluation point of such a desired pattern. Next, the above inclination is calculated from a differentiation value of light beam intensity in the position coordinate $t_1$. Moreover, in calculation of the differentiation value, a portion of $\exp(i(\omega-\omega')t)$ at which a large calculation load is applied refers to the calculation result having been produced by calculating Formula (1) in the preceding step 14, and the calculation can be carried out without requiring new calculation associated with $\exp(i(\omega-\omega')t)$. Thus, an edge deviation quantity can be calculated in a short period of time.

Next, calculation times were compared in a case of calculating a trigonometric function as in the prior art and in a case of referring to a calculation result attained at a preceding step as in the present embodiment. Here, comparison was made by using a method for calculating $\sin(\omega-\omega')t$ in Formula ($\exp(i(\omega-\omega')t)=\cos(\omega-\omega')t-i\sin(\omega-\omega')t$) as a trigonometric function.

A time required for making a calculation of $\sin(\omega-\omega')t$ by 10,000,000 times was about 6 seconds. On the other hand, a time required for referring to the previously calculated $\sin(\omega-\omega')t$ by 10,000,000 times was about 0.6 seconds. That is, a rate of these two calculation times is 10:1. The rate of 10:1 is also almost the same in the calculation of $\cos(\omega-\omega')t$, and further, this tendency is also almost the same in calculation of $\exp(i(\omega-\omega')t)$ in which addition and subtraction are added. In addition, it was verified that a rate of calculation times is almost the same even in actually calculating Formula (1) of light beam intensity.

Namely, assuming that a time required for calculating light beam intensity of two evaluation points is 2, a time required for calculating light beam intensity at one evaluation point and a differentiation value at the evaluation point is about 1.1. Thus, according to the present embodiment, a time required for calculating light beam intensity is reduced to about ½ of the conventional calculation time. This calculation time can be further reduced if computer performance is improved and the calculation method is more sophisticated. A rate of calculation times in a case of obtaining the Fourier transform two times and a case of carrying out the Fourier transform one time and referring to that differentiation coefficient is maintained to be about 2:1 regardless of other factors.

In the present embodiment, as previously described, a calculation result of the edge deviation quantity is verified. Based on the verification result, in a case where the edge position of the finish pattern is deviated over the allowable range specified at a device design stage from that of the desired pattern, the design pattern 2 is corrected by OPC, PPC, or the like. Then, the step of calculating the edge deviation quantity described above is again carried out for the corrected design pattern. In this manner, the design pattern is corrected such that the edge deviation quantity between the desired pattern 1 and the finish pattern is within the allowable range specified at the device design.

A mask having the verified and corrected design pattern is formed and used in manufacturing a semiconductor device. Specifically, a mask having the verified and corrected design pattern is formed by using light beam exposure, known lithography, etc. Using the mask thus formed, the design pattern is transferred on a semiconductor wafer via the mask. Thereafter, patterning is carried out to form on the semiconductor wafer a pattern corresponding to the corrected design pattern. Masks having various design patterns in accordance with the semiconductor device to be formed, are successively used, and the patterning process is repeated. In this manner, a semiconductor device is formed on the semiconductor wafer. With the manufacturing method, since the design patterns of the masks have been verified and corrected, it is possible to provide a semiconductor device having high precision.

Second Embodiment

Figure 3:
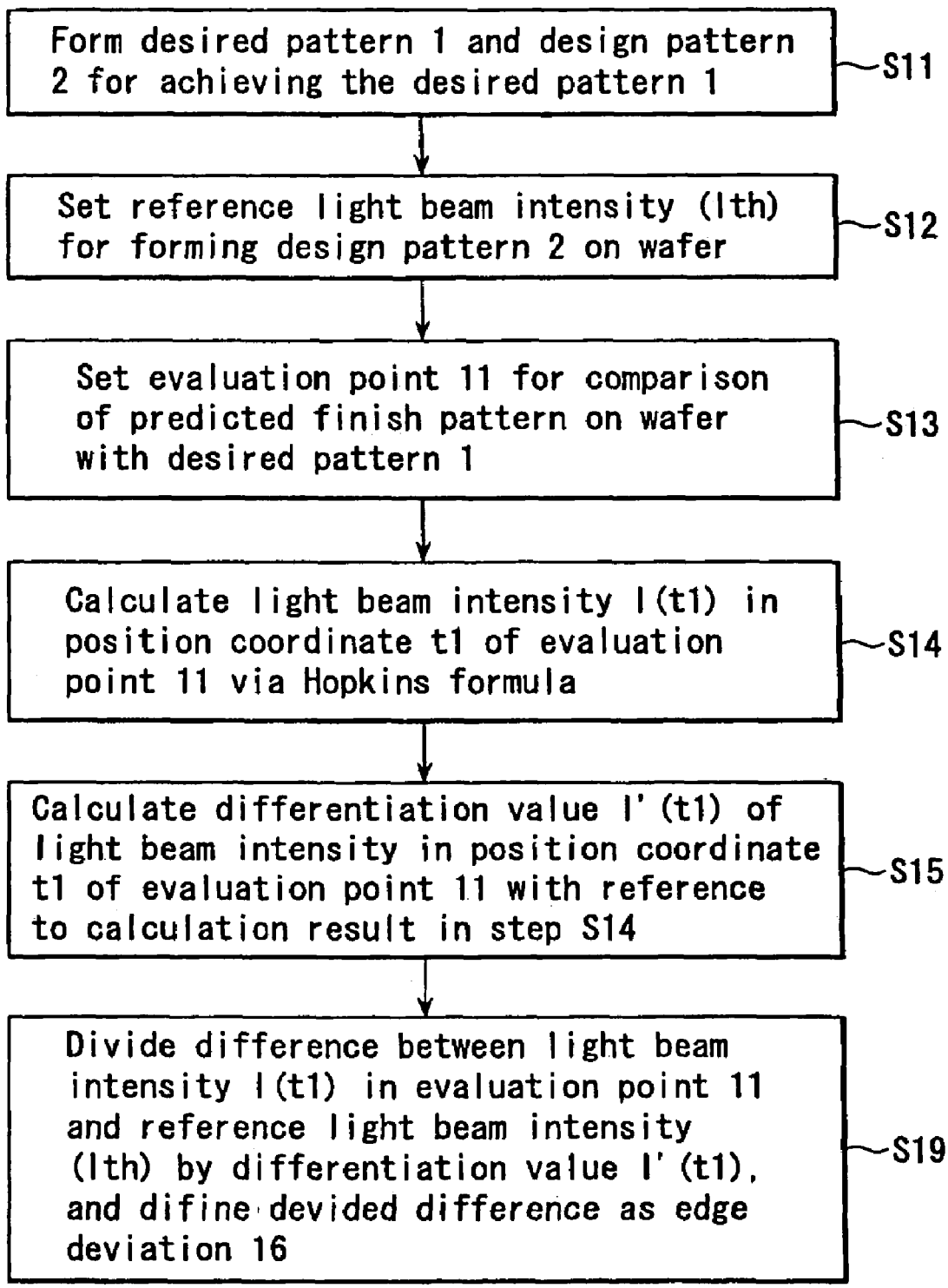
FIG. 3 is a flow chart showing procedures for calculating and verifying an edge deviation quantity according to a second embodiment of the present invention.

Now, a calculation method and a verification method for an edge deviation quantity according to a second embodiment of the present invention will be described with reference to FIG. 3. In FIG. 3, like steps in the first embodiment are designated by like reference numerals. A description of like steps is omitted, and only different steps will be described here.

The present embodiment is different from the above-described first embodiment in that, instead that the position coordinate $t_2$ of the intersection 14 at which the light beam intensity becomes the reference light beam intensity (Ith) is calculated from the straight line 13 denoting a differentiation value, and a difference between the position coordinate $t_2$ and the position coordinate $t_1$ of the evaluation point 11 is defined as an edge deviation quantity, light beam intensity $I(t_1)$ in the position coordinate of the evaluation point 11 and one-story differentiation of the light beam intensity is calculated, and an edge deviation quantity is calculated. That is, an edge deviation quantity $\Delta CD$ can be obtained by the formula below.

$$\Delta CD = (I(t)-Ith)/\text{inclination} \tag{3}$$

In this formula, $\Delta CD$ represents an edge deviation quantity; $I(t)$ represents a light beam intensity in a position coordinate $(t)$ of an evaluation point; Ith represents a reference light beam intensity; and a inclination represents one-story differentiation of a position coordinate of an evaluation point, respectively.

In the present embodiment, first, as in the above-described first embodiment, step 11 to step 15 are carried out. Then, the edge deviation quantity 16 is calculated by the Formula (3), by using the light beam intensity $I(t_1)$ in the position coordinate t1 of the evaluation point 11 calculated in step 14, the reference light beam intensity Ith set in step 12, and the inclination which is a differentiation value calculated in step 15 (step S19).

Then, the calculation result of the edge deviation quantity is verified in the same manner as that in the above-described first embodiment. Based on the verification result, in a case where the edge position of the finish pattern is deviated over an allowable range specified at a device design stage from that of the desired pattern, the design pattern 2 is corrected by means OPC, PPC or the like. Then, the step of calculating the edge deviation quantity described above is again carried out for the corrected design pattern. In this manner, the design pattern is corrected such that the position deviation quantity between the desired pattern 1 and the finish pattern is within the allowable range specified at the device design stage.

In the second embodiment, as in the first embodiment, a inclination of the light beam intensity of a desired pattern, which is in the vicinity of the evaluation point in the position coordinate, is attained by first calculating Formula (1) with respect to a position coordinate $t_1$ of an evaluation point of one desired pattern, and then carrying out calculation by using a differentiation value of light beam intensity in this position coordinate $t_1$. Hence, the edge deviation quantity can be calculated in a short period of time. Moreover, calculation of a differentiation value of steps 15 and 16 in the first embodiment and calculation of a position coordinate $t_2$ which becomes an intersection 14 between a straight line 13 denoting this differentiation value and the reference light beam intensity Ith can be omitted, and thus the calculation time of the edge deviation quantity is reduced as compared with the first embodiment.

Also in this embodiment, a calculation result of the edge deviation quantity is verified. Based on the verification result, in a case where the edge position of the finish pattern is deviated over the allowable range specified at a device design stage from that of the desired pattern, the design pattern 2 is corrected by OPC, PPC, or the like. Then, the step of calculating the edge deviation quantity described above is again carried out for the corrected design pattern. In this manner, the design pattern is corrected such that the edge deviation quantity between the desired pattern 1 and the finish pattern is within the allowable range specified at the device design.

A mask having the verified and corrected design pattern is formed and used in manufacturing a semiconductor device. Specifically, a mask having the verified and corrected design pattern is formed by using light beam exposure, known lithography, etc. Using the mask thus formed, the design pattern is transferred on a semiconductor wafer via the mask. Thereafter, patterning is carried out to form on the semiconductor wafer a pattern corresponding to the corrected design pattern. Masks having various design patterns in accordance with the semiconductor device to be formed, are successively used, and the patterning process is repeated. In this manner, a semiconductor device is formed on the semiconductor wafer. With the manufacturing method, since the design patterns of the masks have been verified and corrected, it is possible to provide a semiconductor device having high precision.

EXAMPLE 1

Figure 4:
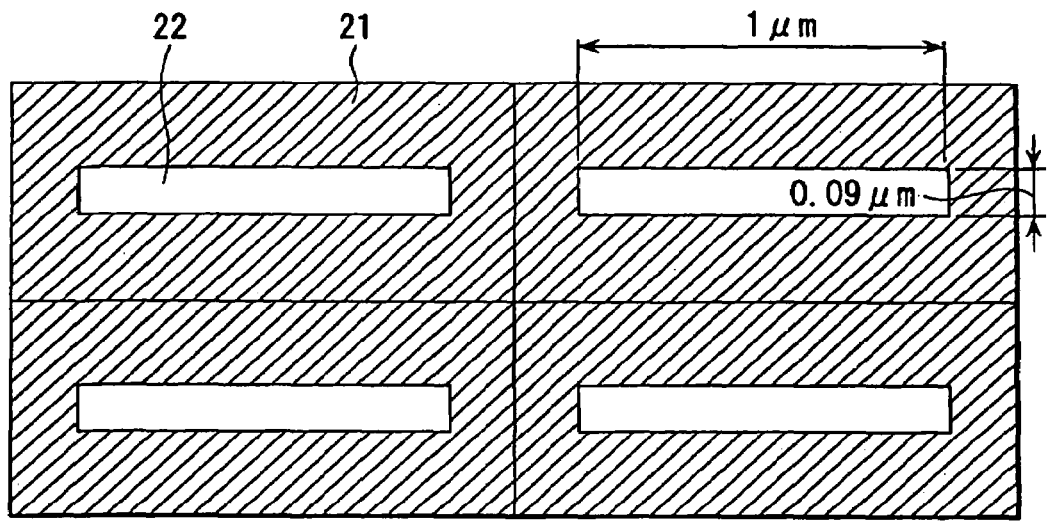
FIG. 4 is a diagram showing a mask having a pattern.
Figure 5:
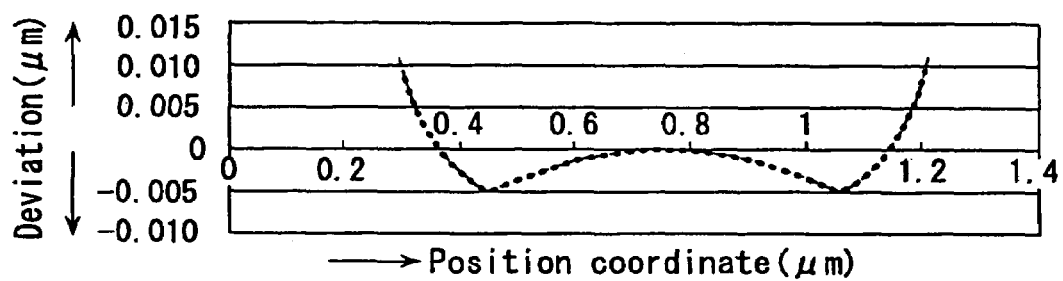
FIG. 5 is a characteristic curve showing an edge deviation from a design data.
Figure 6:
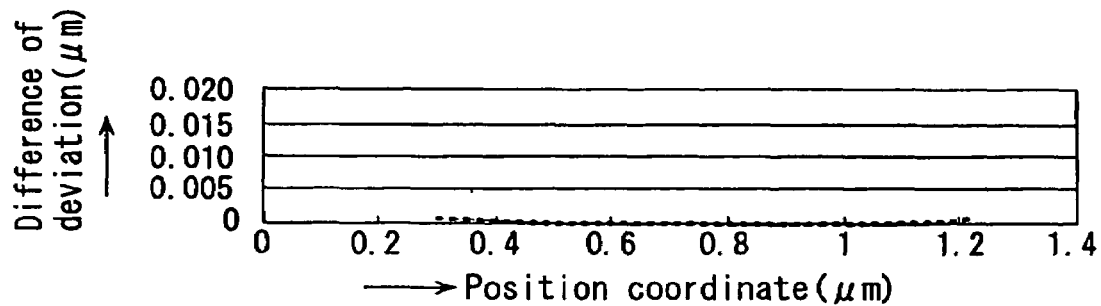
FIG. 6 is a characteristic curve showing a difference between edge deviations.

As an example, by referring to FIGS. 4-6, comparison is made between a deviation quantity obtained by the method of calculating an edge deviation quantity according to the present embodiments with a deviation quantity obtained by a conventional method for calculating an edge deviation quantity, while specifying a mask pattern used.

As shown in FIG. 4, a dark field mask 21 is provided as a mask. The dark field mask 21 has a cutout pattern 22 of a rectangle of 1 µm in a direction of a long side and 0.09 µm in a direction of a short side. OPC is applied to the dark field mask 21, and using the corrected mask, a finish pattern is calculated under a condition of 193 nm in exposure light wavelength, 0.75 in numerical aperture (NA), 0.85 in coherent factor (σ), ⅔ ring band illumination (illumination center shield rate), and the reference exposure quantity Ith=0.218.

Then, a long side pattern edge of a rectangle of the design data of the mask is divided into equal intervals along the long side edge. In accordance with the method according to the present embodiment, the light beam intensity in the position coordinate of each division point and one-story differentiation of the light beam intensity are calculated, an edge deviation quantity (ΔCD1) from the design data is obtained, and the thus obtained quantity is indicated by a dotted line in FIG. 5.

On the other hand, in accordance with the conventional method, an edge deviation quantity (ΔCD2) from the design data is obtained from the light beam intensity in the position coordinate of the division point and a light beam intensity in a position coordinate slightly displaced from the position coordinate, and the thus obtained quantity is indicated by a broken line in FIG. 5. As shown in FIG. 5, a curve indicating the edge deviation quantity according to the method of the present embodiments and a curve indicting the edge deviation quantity according to the conventional method almost overlap with each other. A horizontal axis of FIG. 5 indicates a position coordinate indicated in units of microns, and a vertical axis indicates an edge deviation quantity indicated in units of microns.

FIG. 6 shows a difference (ΔCD2−ΔCD1) between the edge deviation quantity (ΔCD1) obtained by the method of the present embodiment and the edge deviation quantity (ΔCD2) obtained by the conventional method. As in FIG. 5, in FIG. 6, a horizontal axis indicates a position coordinate indicated in units of microns, and a vertical axis indicates a difference in edge deviation quantity indicated in units of microns. As shown in FIG. 6, the difference of the two lines indicating the edge deviations is as small as 0.001 µm (1 nm) or less, except for a portion corresponding to a pattern corner. Namely, it is found that there is almost no difference between the edge deviation quantity obtained by the method of the present embodiments and the edge deviation quantity obtained by the conventional method.

According to the present embodiments, on the other hand, the calculation time is about half of that in the case of using the conventional method.

Therefore, according to the present embodiments, an edge deviation quantity can be calculated with high speed, without decreasing the precision.

EXAMPLE 2

Figure 7:
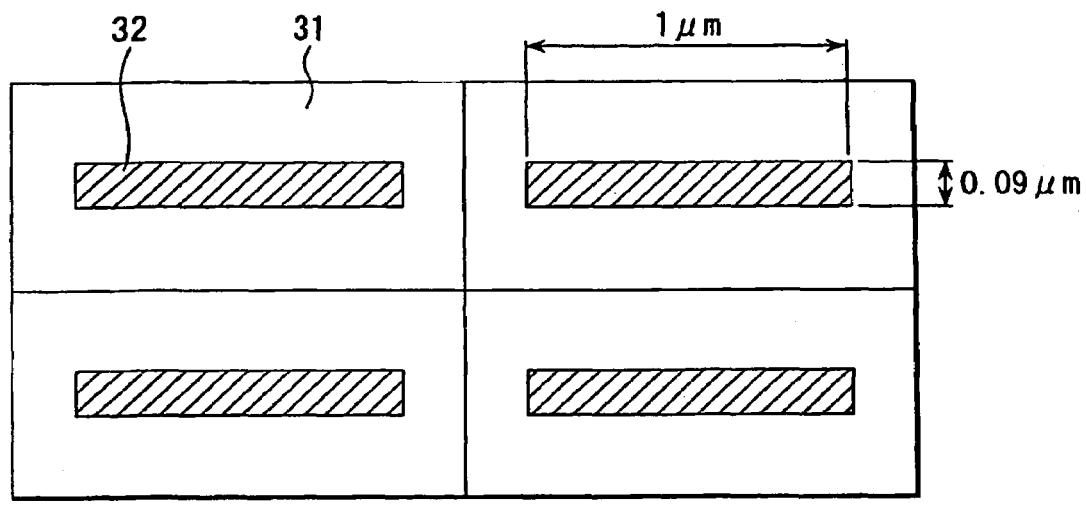
FIG. 7 is a diagram showing a mask having a pattern.

As another example of the mask pattern, FIG. 7 shows a bright field mask 31. The bright field mask 31 has a remaining pattern 32 of a rectangle of 1 µm in a direction of a long side and 0.09 µm in a direction of a short side. Similarly to the Example 1 with reference to FIGS. 4-6, a deviation quantity obtained by the method of calculating an edge deviation quantity according to the present embodiment is compared with that of the conventional method, and a comparison result is shown in FIG. 8.

That is, a long side pattern edge of a rectangle of the design data of the mask is divided into equal intervals along the long side edge. In accordance with the method according to the present embodiment, the light beam intensity in the position coordinate of each division point and one-story differentiation of the light beam intensity are calculated, an edge deviation quantity (ΔCD1) from the design data is obtained, and the thus obtained quantity is indicated by a dotted line in FIG. 8.

Figure 8:
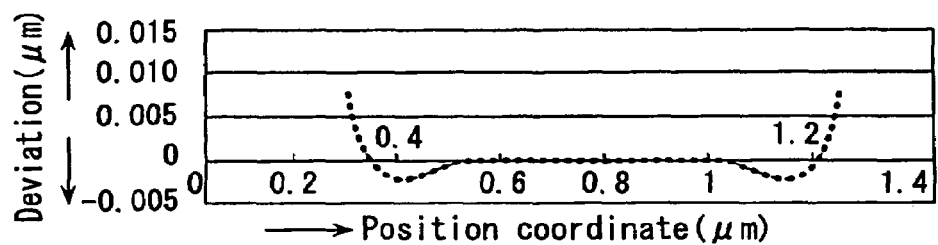
FIG. 8 is a characteristic curve showing an edge deviation from a design data.

On the other hand, in accordance with the conventional method, an edge deviation quantity (ΔCD2) from the design data is obtained from the light beam intensity in the position coordinate of the division point and a light beam intensity in a position coordinate slightly displaced from the position coordinate, and the thus obtained quantity is indicated by a broken line in FIG. 8. As shown in FIG. 8, a curve indicating the edge deviation quantity according to the method of the present embodiments and a curve indicting the edge deviation quantity according to the conventional method almost overlap with each other. A horizontal axis of FIG. 8 indicates a position coordinate indicated in units of microns, and a vertical axis indicates an edge deviation quantity indicated in units of microns.

Figure 9:
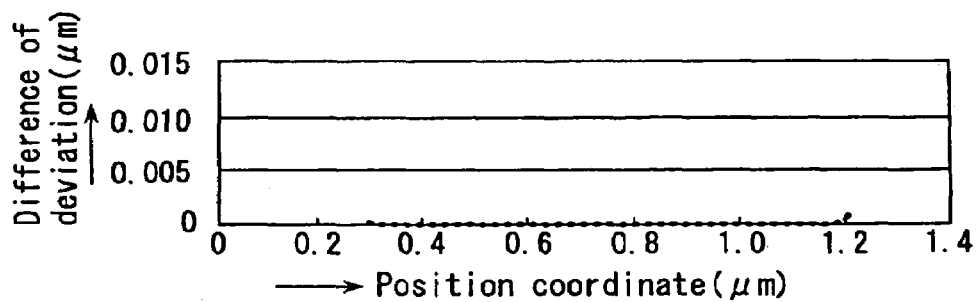
FIG. 9 is a characteristic curve showing a difference between edge deviations.

FIG. 9 shows a difference ($\Delta CD2 - \Delta CD1$) between the edge deviation quantity ($\Delta CD1$) obtained by the method of the present embodiment and the edge deviation quantity ($\Delta CD2$) obtained by the conventional method. As shown in FIG. 9, the difference of the two lines indicating the edge deviations is as small as 0.001 µm (1 nm) or less, except for a portion corresponding to a pattern corner. Namely, it is found that there is almost no difference between the edge deviation quantity obtained by the method of the present embodiments and the edge deviation quantity obtained by the conventional method. As in FIG. 8, in FIG. 9, a horizontal axis indicates a position coordinate indicated in units of microns, and a vertical axis indicates a difference in edge deviation quantity indicated in units of microns.

According to the present embodiments, on the other hand, as previously described, the calculation time is about half of that in the case of using the conventional method.

Therefore, according to the present embodiments, an edge deviation quantity can be calculated with high speed, without decreasing the precision.

Third Embodiment

Now, a verification program and a verification system for an edge deviation quantity according to a third embodiment of the present invention will be described with reference to FIGS. 10 and 11.

Figure 10:
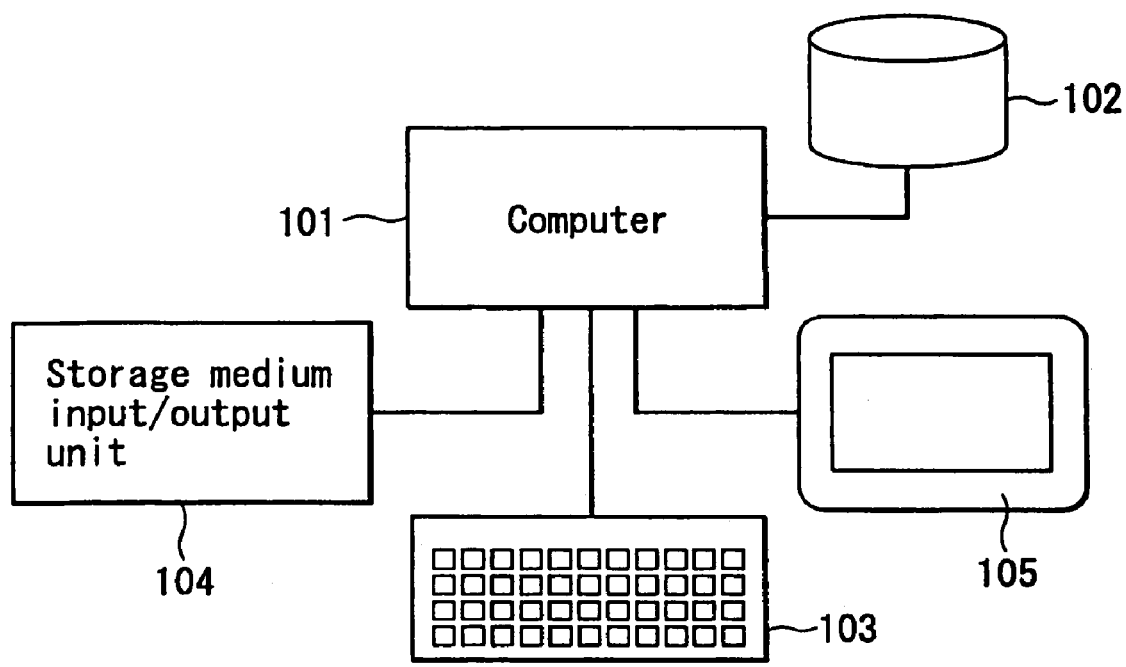
FIG. 10 is a schematic diagram showing a verification system for an edge deviation quantity according to a third embodiment of the present invention.

An edge deviation quantity verification system 100 is shown in FIG. 10. The system 100 comprises a computer 101 which makes computing processing and controls each unit; a storage unit 102 which stores a computation result, a verification program and the like; an input unit 103 which inputs each input data and the like; a storage medium input/output unit 104 which writes a verification program into the storage unit 102 from a storage medium such as an optical disk having stored therein a verification program produced by another computer; and a display unit 105 which displays input/output information, a computation result and the like. A verification program as shown in FIG. 11 is installed in the edge deviation quantity verification system 100.

The verification program is inputted from the input unit 103 such as a keyboard by an operator, while observing the display unit 105. Alternatively, the verification program produced by another computer is inputted to the computer 101 through the storage medium input/output unit 104 via a storage medium such as an optical disk, and the thus inputted verification program is stored in the storage unit 102.

Then, this verification program can be executed, while observing the display unit 105, by reading out the verification program stored in the storage unit 102 at a computing unit, and inputting required data and the like including an initial condition via the input unit 103. When calculation terminates, the obtained edge deviation quantity or the like is stored in the storage unit 102. The edge deviation quantity or the like stored in the storage unit 102 can be displayed on a screen of the display unit 105, outputted to a printer (not shown), or outputted via the storage medium input/output unit 104 to a storage medium such as a disk or a semiconductor memory.

Here, although an independent verification system has been shown as an example of the verification system, a communication adapter (not shown) for making connection with a data processing network or the like may be provided.

Figure 11:
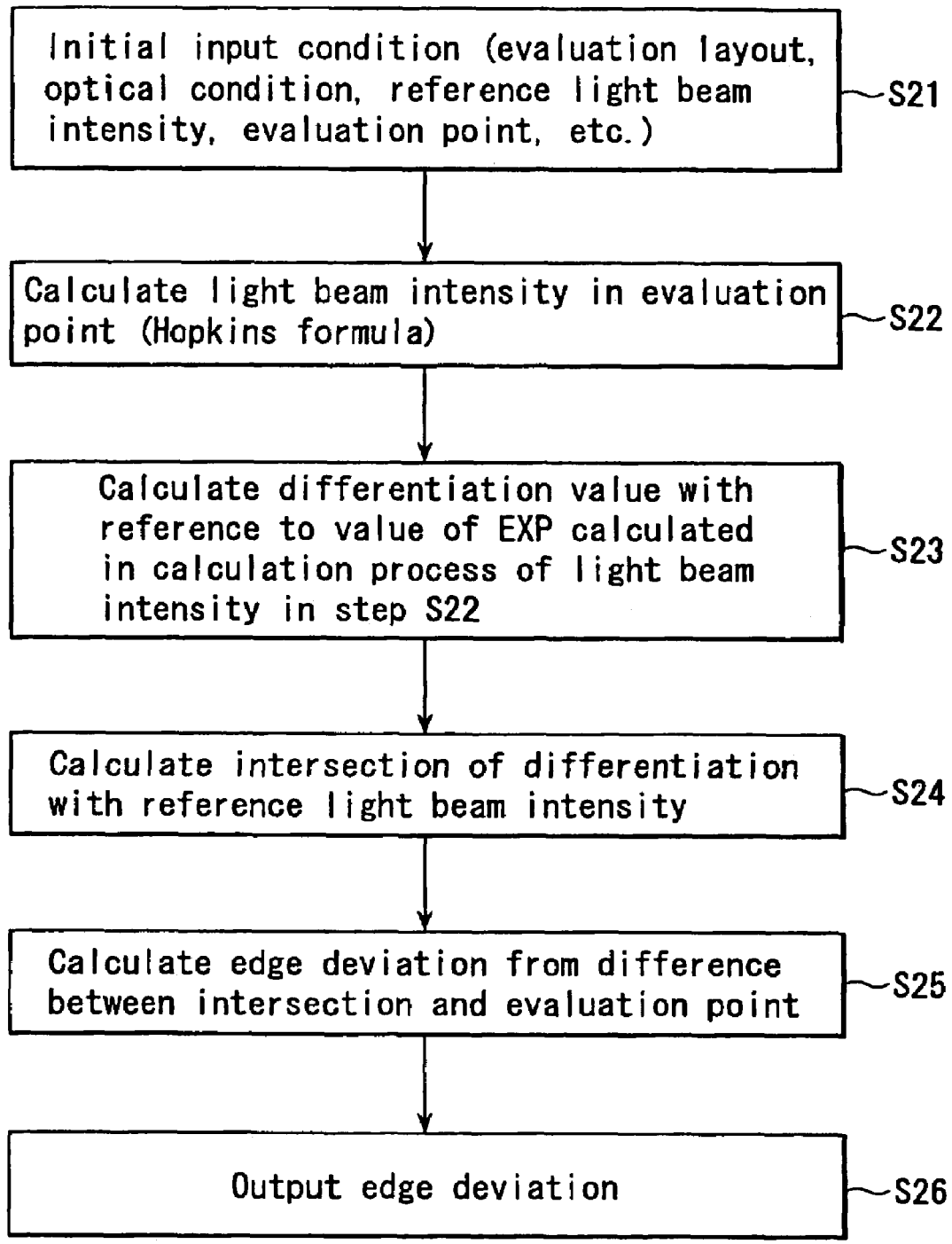
FIG. 11 is a flow chart showing an outline of a calculation program for an edge deviation quantity according to the third embodiment of the invention.

Now, a program for carrying out calculation of an edge deviation quantity shown in the above-described first embodiment is shown in FIG. 11. The program comprises a step S21 of inputting an evaluation layout of a desired pattern, a design pattern and the like, an optical condition specified by an exposure device or the like, a reference light beam intensity specified by a photo etching process or the like, a position coordinate of a point to be evaluated, and the like; a step S22 of calculating a light beam intensity of an evaluation point in accordance with Hopkins Formula (1); a step S23 of calculating a differentiation value in accordance with Formula (2) by referring to the EXP portion of Formula (1) calculated during the light beam intensity calculation in step S22; a step S24 of calculating an intersection of a differentiation value with a reference light beam intensity; a step S25 of calculating a difference between the intersection and the evaluation point, and defining the calculated difference as an edge deviation quantity; and a step S26 of outputting the resultant obtained deviation quantity.

Figure 12:
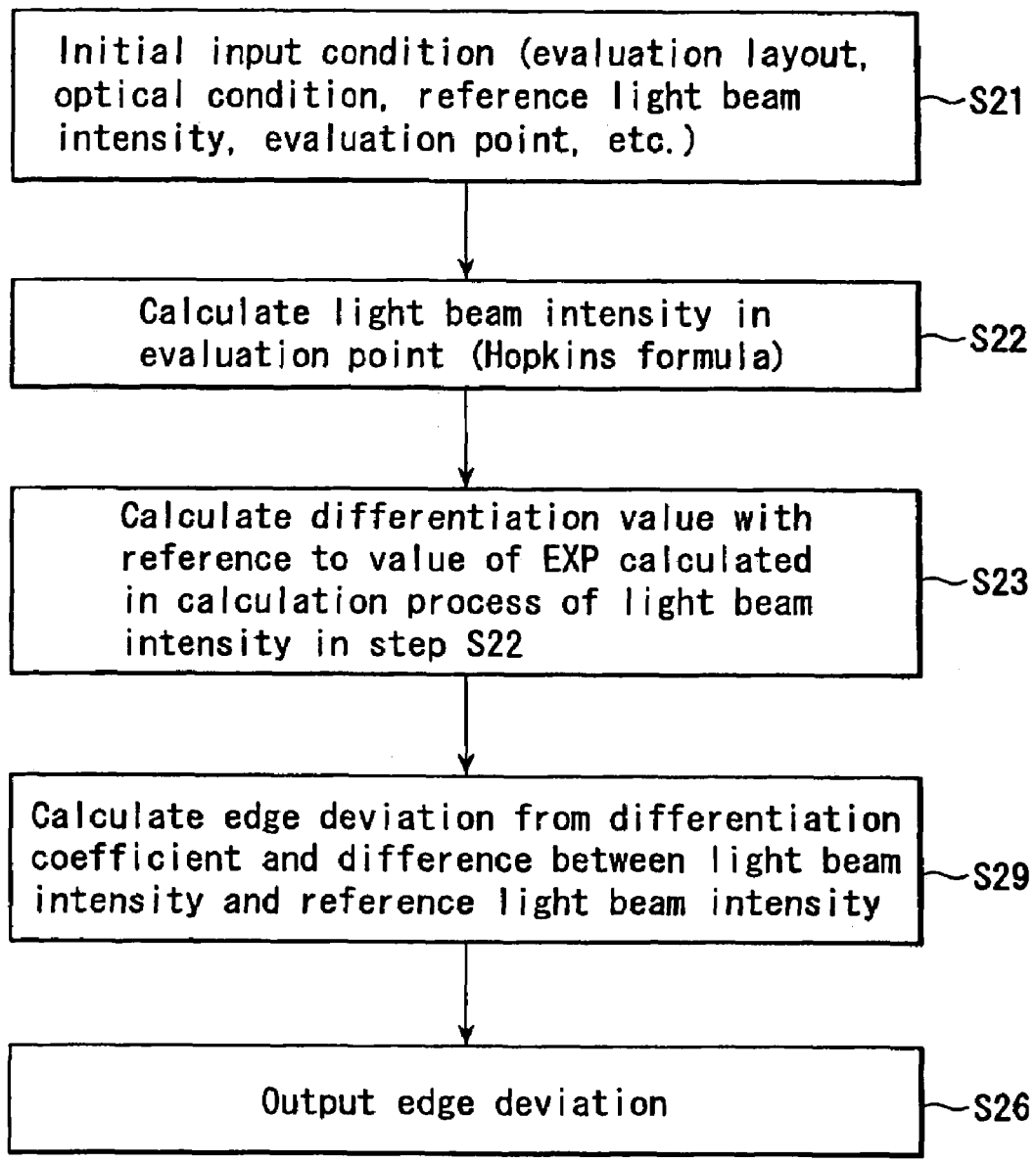
FIG. 12 is a flow chart showing an outline of another calculation program for an edge deviation quantity according to the third embodiment of the invention.
Figure 13:
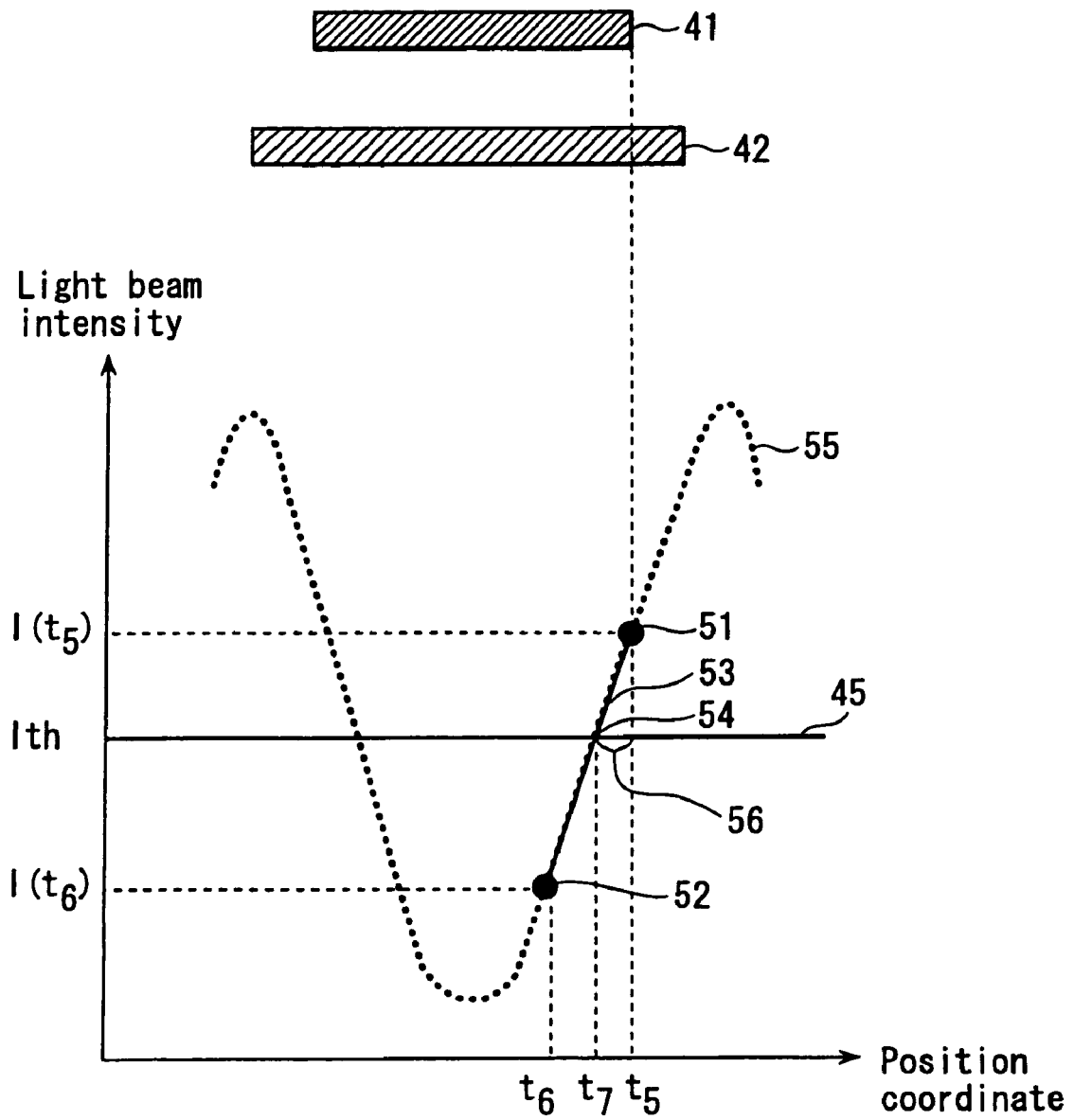
FIG. 13 is a diagram for explaining a conventional method of calculating an edge deviation quantity.
Figure 14:
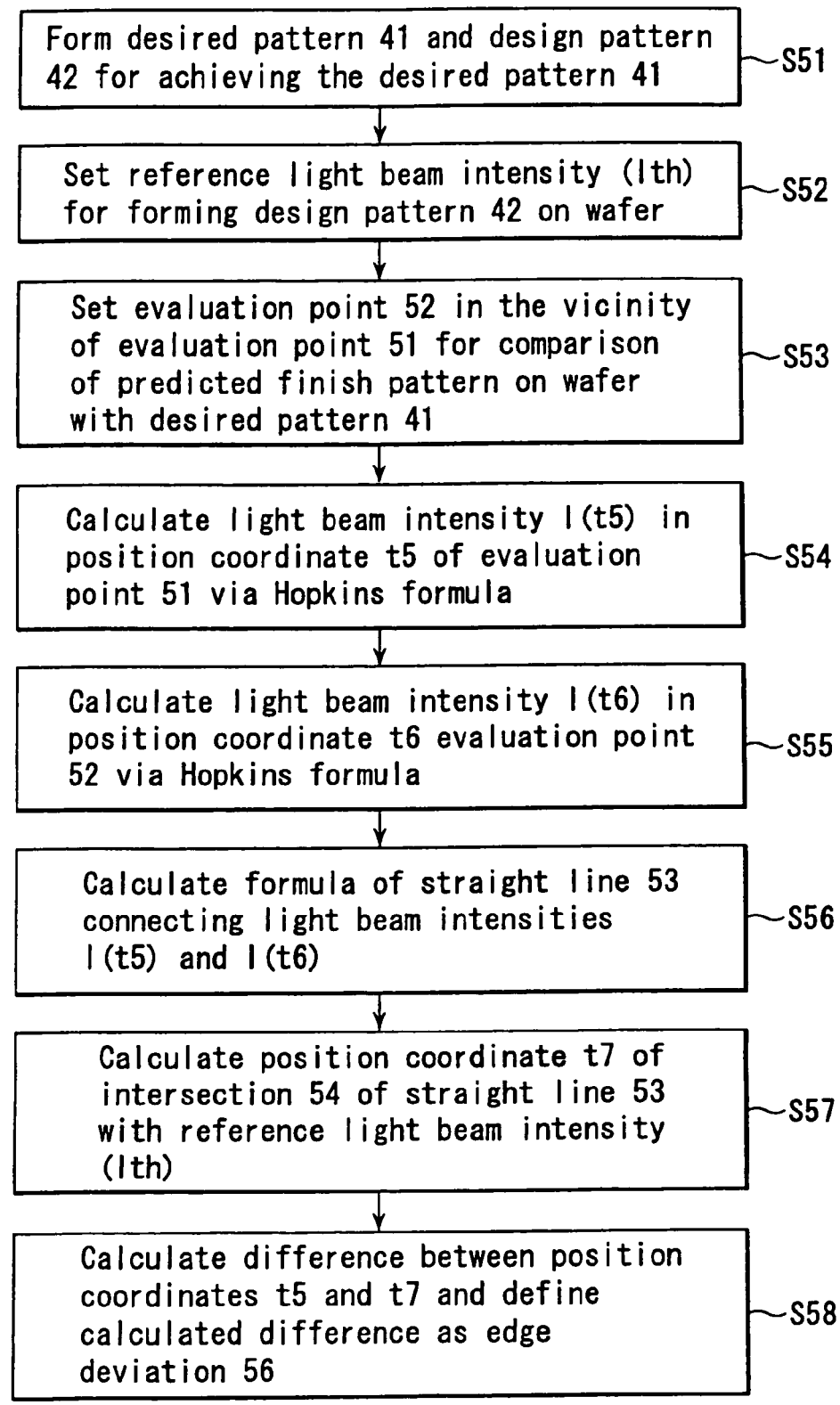
FIG. 14 is a flow chart showing a conventional procedures for calculating an edge deviation quantity.
Figure 15:
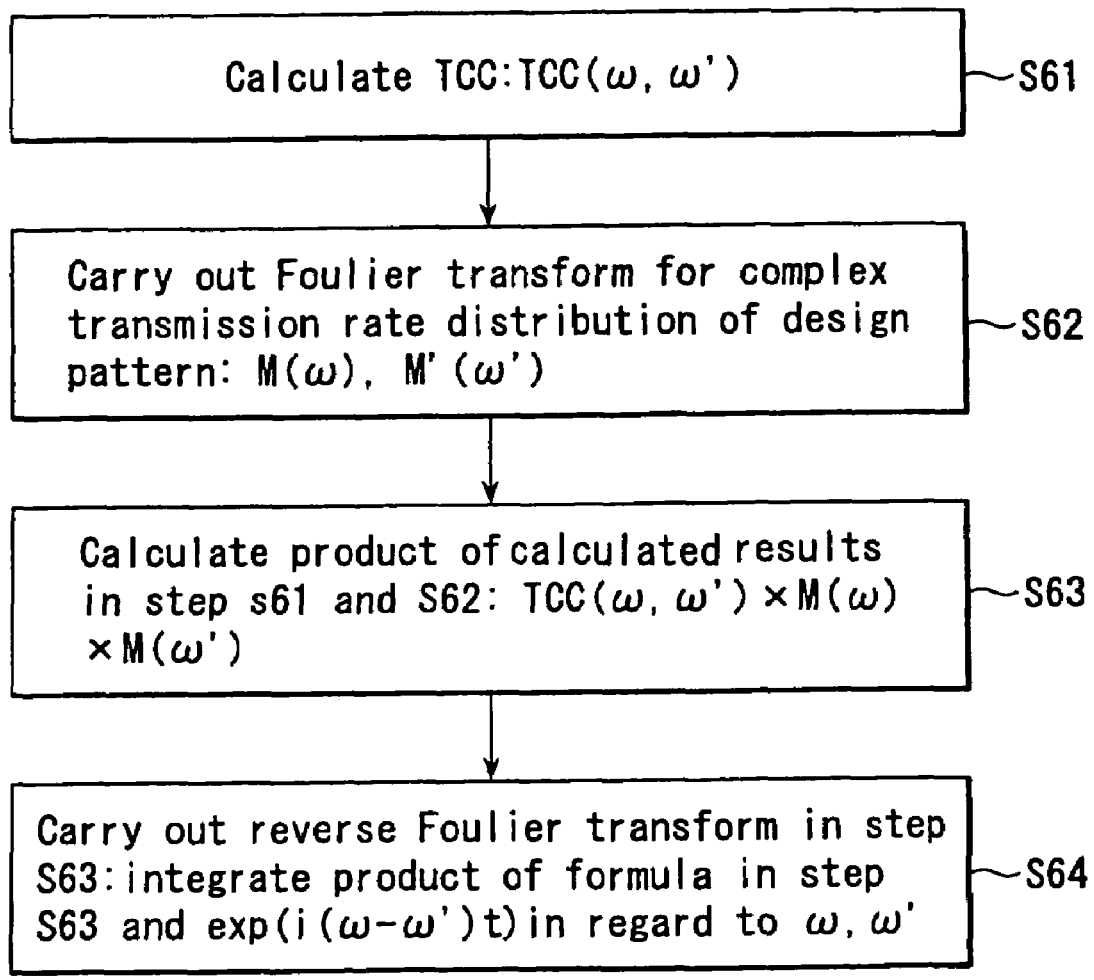
FIG. 15 is a flow chart showing procedures for calculating a partial coherent image forming Formula of Hopkins.

Further, a program for carrying out calculation and verification of an edge deviation quantity, described in the second embodiment, is shown in FIG. 12. The program comprises, instead of steps S24 and S25 in the flow chart of FIG. 11, a step S29, as shown in FIG. 12, of dividing a difference between a light beam intensity and a reference light beam intensity by a differentiation value which is a inclination.

In the above-described program shown in FIGS. 11 and 12, the step or the like of writing a result of computation processing into a storage unit and reading out the calculation result are omitted. In addition, in the edge deviation calculation program shown in FIG. 11, a step of verifying the edge deviation quantity is added after the step S26. Similarly, in the edge deviation calculation program shown in FIG. 12, a step of verifying the edge deviation quantity is added after the step S29.

As described above, in the present embodiments, calculation can be executed without making an addition or a change to the conventional edge deviation verification system in which an edge deviation quantity has been calculated. Moreover, the execution time can be reduced to about ½ as compared with the conventional calculation of an edge deviation quantity. Therefore, a work whose quantity is about two times as much as conventionally can be carried out by the conventional edge deviation quantity verification system, without making an addition or a change to the conventional system, thus enabling efficient operation of the edge deviation quantity verification system.

Also in this embodiment, a calculation result of the edge deviation quantity is verified. Based on the verification result, in a case where the edge position of the finish pattern is deviated over the allowable range specified at a device design stage from that of the desired pattern, the design pattern 2 is corrected by OPC, PPC, or the like. Then, the step of calculating the edge deviation quantity described above is again carried out for the corrected design pattern. In this manner, the design pattern is corrected such that the edge deviation quantity between the desired pattern 1 and the finish pattern is within the allowable range specified at the device design.

A mask having the verified and corrected design pattern is formed and used in manufacturing a semiconductor device. Specifically, a mask having the verified and corrected design pattern is formed by using light beam exposure, known lithography, etc. Using the mask thus formed, the design pattern is transferred on a semiconductor wafer via the mask. Thereafter, patterning is carried out to form on the semiconductor wafer a pattern corresponding to the corrected design pattern. Masks having various design patterns in accordance with the semiconductor device to be formed, are successively used, and the patterning process is repeated. In this manner, a semiconductor device is formed on the semiconductor wafer. With the manufacturing method, since the design patterns of the masks have been verified and corrected, it is possible to provide a semiconductor device having high precision.

The embodiments of the present invention have been described above. Other various embodiments and modifications may further be provided.

For example, in each of the described embodiments, a product of a coefficient $(i(\omega-\omega'))^n$ attained when a differentiation value of a light beam intensity in the vicinity of an evaluation point has been calculated with an angular frequency distribution component is first calculated, and then the light beam intensity is obtained by carrying out the reverse Fourier transform. However, it is possible to produce a plurality of TCCs of differentiated form in advance, and carry out the reverse Fourier transform by referring to these TCCs. This method can reduce a calculation load, and it is particularly desirable when a light beam intensity in a wide range is calculated.

In addition, one-story differentiation of a light beam intensity has been used in order to obtain a light beam intensity at a position of an evaluation point. However, when a concept of serial approximation is used, an approximation formula of light beam intensity in the vicinity of a certain evaluation point (coordinate x=a) can be expressed by a polynomial of n-story differentiation in the coordinate of x=a. That is, assuming that the approximation formula is f(x), when n-story differentiation of light beam intensity is $f(x)^{(n)}$ (n=1, 2 ...) and a coefficient is $C_m$ (m=0, 1, 2 ...), they can be expressed as shown in the formula below.

$$f(x)=C_0 f(x=a)+C_1 f^{(1)}(x=a)(X-a)+\ldots+C_{m-1}f(x=a)^{(n-1)}(X-a)^{n-1}+C_m f(x=a)^{(n)}(X-a) \quad (4)$$

In this formula, by interpolating data including a high order term, a light beam intensity in the vicinity of an evaluation point is approximated more precisely, and an edge deviation quantity can be obtained with high precision.

Similarly, an approximation formula of light beam intensity in the vicinity of a certain evaluation point (x=a) can be expressed by a polynomial of n-story differentiation in the coordinate of x=a, and approximation can be carried out by the following Taylor expansion formula $$f(x)=f(x=a)+f^{(1)}(x=a)(X-a)/1!+f^{(2)}(x=a)/2!(X-a)^2+\ldots+f^n(x=a)/n!*(X-a)^n \quad (5)$$

Further, a inclination in a direction vertical to an edge of an evaluation point has been obtained by carrying out one-story differentiation. However, a inclination in a tangent direction with regard to an edge is further obtained and combined with the inclination in the direction vertical to define a inclination. Then, an edge deviation quantity can be calculated from the obtained inclination and a difference between light beam intensity at an evaluation point and a reference exposure quantity.

Furthermore, in the embodiments, an edge deviation quantity during the best focus in which an optical image forms a focus on a wafer has been obtained. However, a variety of de-focuses or an exposure quantity creating a desired dimension can be set without being limited to the best focus.

Moreover, the above embodiments have been described, assuming that ultrasonic light of about 0.1 to 0.2 µm in wavelength is practically used or under development. However, the present invention can be applied even in a situation in which light having a suitable short wavelength or X-ray is required with high integrity, namely, with advancement of a finer semiconductor pattern.

According to aspects of the present invention, there can be provided a calculation method, a verification method, a verification program, and a verification system for an edge deviation quantity capable of significantly reducing and calculating a calculation load at a high speed in calculation of light beam intensity, and a semiconductor manufacturing method.

What is claimed is:

1. A computer-implemented method for generating an edge deviation quantity, in which a desired pattern is compared with a finish pattern to be formed on a wafer, which is predicted from a design pattern, based on a calculation of a light beam intensity, and a deviation quantity of the finish pattern from the desired pattern at each of edges of the finish pattern and the desired pattern is calculated, the method comprising the steps, performed by a computer, of:

setting a reference light beam intensity for setting the desired pattern on a wafer;

setting an evaluation point for comparison of the finish pattern with the desired pattern;

calculating a light beam intensity at the evaluation point;

calculating a differentiation value of the light beam intensity at the evaluation point;

dividing a difference between the light beam intensity at the evaluation point and the reference light beam intensity by the differentiation value, wherein a result of the division is defined as an edge deviation quantity of the finish pattern from the desired pattern; and outputting the edge deviation quantity.

2. The method according to claim 1, wherein the design pattern is a design pattern which specifies a complex transmission rate distribution, and the calculating of the light beam intensity at the evaluation point comprises:

calculating a Fourier transform of the complex transmission rate distribution of the design pattern;

calculating a mutual transmission coefficient;

calculating a product of the mutual transmission coefficient with the complex transmission rate distribution and a value obtained as a result of the Fourier transform of the complex transmission rate distribution; and calculating a reverse Fourier transform of the product.

3. The method according to claim 1, wherein the calculating of the light beam intensity at the evaluation point is obtained by a polynomial of n-story (n is a natural number) differentiation of the light beam intensity at the evaluation point.

4. The method according to claim 3, wherein, when an n-story differentiation of a light beam intensity in a vicinity of a position coordinate x=a of the evaluation point is defined as $f(x)^{(n)}$ (n=1, 2 ...), and a coefficient is defined as $C_m$ (m=0, 1, 2, ...), a polynomial of the n-story differentiation is provided as the following polynomial:

$$f(x)=C_0 f(x=a)+C_1 f^{(1)}(x=a)(X-a)+\ldots+C_{m-1}f(x=a)^{(n-1)}(X-a)^{n-1}+C_m f(x=a)^{(n)}(X-a)^n.$$

5. The method according to claim 3, wherein a polynomial of the n-story differentiation is provided as the following polynomial in which n-story differentiation of a light beam intensity in a vicinity of a position coordinate x=a of the evaluation point is obtained by Taylor expansion when x=a:

$$f(x)=f(x=a)+f^{(1)}(x=a)(X-a)/1!+f^{(2)}(x=a)/2!(X-a)^2+\ldots+f^n(x=a)/n!*(X-a)^n.$$

6. A computer-implemented method for verifying an edge deviation quantity, in which a desired pattern is compared with a finish pattern to be formed on a wafer, which is predicted from a design pattern, based on a calculation of a light beam intensity, a deviation quantity of the finish pattern from the desired pattern at each of edges of the finish pattern and the desired pattern is calculated, and it is determined whether or not the design pattern is to be corrected based on a result of the calculation of the deviation quantity, the method comprising the steps, performed by a computer, of:

setting a reference light beam intensity for setting the desired pattern on a wafer;

setting an evaluation point for comparison of the finish pattern with the desired pattern;

calculating a light beam intensity at the evaluation point;

calculating a differentiation value of the light beam intensity at the evaluation point;

dividing a difference between the light beam intensity at the evaluation point and the reference light beam intensity by the differentiation value, and defining a result of the division as an edge deviation quantity; and verifying the edge deviation quantity, wherein, in the case where the edge deviation quantity exceeds an allowable range, the design pattern is corrected based on the deviation quantity.

* * * * *